United States Patent
Kumar et al.

(10) Patent No.: US 10,629,753 B2
(45) Date of Patent: Apr. 21, 2020

(54) SPLIT-GATE FLASH MEMORY CELL AND METHOD FOR FORMING THE SAME

(71) Applicant: Vanguard International Semiconductor Corporation, Hsinchu (TW)

(72) Inventors: Manoj Kumar, Jharkhand (IN); Ankit Kumar, Jharkhand (IN); Chia-Hao Lee, New Taipei (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 15/838,718

(22) Filed: Dec. 12, 2017

(65) Prior Publication Data

US 2019/0181269 A1 Jun. 13, 2019

(51) Int. Cl.
| | |
|---|---|
| *H01L 29/788* | (2006.01) |
| *H01L 29/423* | (2006.01) |
| *H01L 29/66* | (2006.01) |
| *H01L 21/28* | (2006.01) |
| *H01L 21/311* | (2006.01) |
| *H01L 21/3213* | (2006.01) |
| *H01L 29/49* | (2006.01) |
| *H01L 27/11524* | (2017.01) |

(52) U.S. Cl.
CPC .... *H01L 29/7881* (2013.01); *H01L 29/40114* (2019.08); *H01L 29/42324* (2013.01); *H01L 29/66825* (2013.01); *H01L 21/31144* (2013.01); *H01L 21/32135* (2013.01); *H01L 21/32139* (2013.01); *H01L 27/11524* (2013.01); *H01L 29/4916* (2013.01)

(58) Field of Classification Search
CPC .......... H01L 29/7881; H01L 29/42324; H01L 29/66825; H01L 29/4916; H01L 21/28273; H01L 21/31144; H01L 21/32135; H01L 21/32139; H01L 27/11524

See application file for complete search history.

(56) References Cited

U.S. PATENT DOCUMENTS

| | | | |
|---|---|---|---|
| 5,970,371 A | 10/1999 | Hsieh et al. | |
| 6,420,233 B1* | 7/2002 | Hsieh ................ | H01L 29/42324 438/257 |
| 6,653,188 B1* | 11/2003 | Huang .............. | H01L 29/40114 438/257 |
| 6,768,162 B1 | 7/2004 | Chang et al. | |
| 7,115,470 B2 | 10/2006 | Park et al. | |

(Continued)

FOREIGN PATENT DOCUMENTS

TW 200522130 A 7/2005

*Primary Examiner* — Sitaramarao S Yechuri

(74) *Attorney, Agent, or Firm* — Birch, Stewart, Kolasch & Birch, LLP

(57) ABSTRACT

A split-gate flash memory cell is provided. The split-gate flash memory cell includes a semiconductor substrate, a floating gate dielectric on the semiconductor substrate, and a floating gate. The floating gate includes a conductive layer on the floating gate dielectric, and a pair of conductive spacers on a top surface of the conductive layer. The split-gate flash memory cell also includes an inter-gate dielectric covering the floating gate, including sidewalls of the conductive layer and the conductive spacers. The split-gate flash memory cell also includes a control gate on the inter-gate dielectric.

20 Claims, 11 Drawing Sheets

(56) References Cited

U.S. PATENT DOCUMENTS

| | | | |
|---|---|---|---|
| 7,122,857 B2* | 10/2006 | Lin | H01L 27/11521 |
| | | | 257/316 |
| 8,389,356 B2* | 3/2013 | Wang | H01L 27/11521 |
| | | | 438/257 |
| 2007/0063260 A1* | 3/2007 | Chuang | H01L 27/11521 |
| | | | 257/315 |
| 2008/0042185 A1* | 2/2008 | Lojek | H01L 27/115 |
| | | | 257/315 |
| 2010/0244120 A1* | 9/2010 | Kang | B82Y 10/00 |
| | | | 257/325 |
| 2012/0241839 A1* | 9/2012 | White | H01L 27/11524 |
| | | | 257/316 |
| 2015/0035034 A1* | 2/2015 | Winstead | H01L 29/66833 |
| | | | 257/314 |
| 2015/0263015 A1* | 9/2015 | Sung | H01L 29/42324 |
| | | | 257/316 |
| 2015/0348985 A1* | 12/2015 | Loiko | H01L 27/11568 |
| | | | 257/314 |

* cited by examiner

SPLIT-GATE FLASH MEMORY CELL AND METHOD FOR FORMING THE SAME

BACKGROUND

Embodiments of the present disclosure relate to a flash memory cell, and in particular they relate to a split-gate flash memory cell.

Non-volatile memory devices are widely used in the electronics industry. The data stored in a non-volatile memory may be retained even if system power is lost. Non-volatile memory may take the form of one-time programmable devices, such as electrically programmable read-only memory (EPROM), or re-programmable devices, such as electrically erasable, programmable read-only memory (EEPROM).

One example of non-volatile memory is flash memory. Flash memories are becoming popular due to their advantages, which include smaller sizes and less power consumption.

However, existing flash memories have not been satisfactory in every respect.

SUMMARY

Some embodiments of the present disclosure relate to a split-gate flash memory cell. The split-gate flash memory cell includes a semiconductor substrate, a floating gate dielectric on the semiconductor substrate, and a floating gate. The floating gate includes a conductive layer on the floating gate dielectric, and a pair of conductive spacers on a top surface of the conductive layer. The split-gate flash memory cell also includes an inter-gate dielectric covering the floating gate, including sidewalls of the conductive layer and the conductive spacers. The split-gate flash memory cell also includes a control gate on the inter-gate dielectric.

Some embodiments of the present disclosure relate to a method for forming a split-gate flash memory cell. The method includes providing a semiconductor substrate, forming a first dielectric layer on the semiconductor substrate, forming a first conductive layer on the first dielectric layer, and forming a mask layer on the first conductive layer. The mask layer has an opening exposing a first portion of the first conductive layer. The method also includes forming a pair of conductive spacers on opposite sidewalls of the opening and on a top surface of the first portion of the first conductive layer, forming a dielectric material to fill the opening, removing the mask layer and portions of the first conductive layer under the mask layer, while leaving the pair of conductive spacers and the first portion of the first conductive layer whereby a floating gate is formed on the first dielectric layer, forming a second dielectric layer on sidewalls of the first portion of the first conductive layer and the pair of conductive spacers; and forming a control gate on the first dielectric layer, the second dielectric layer and the dielectric material.

BRIEF DESCRIPTION OF THE DRAWINGS

Aspects of the embodiments of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
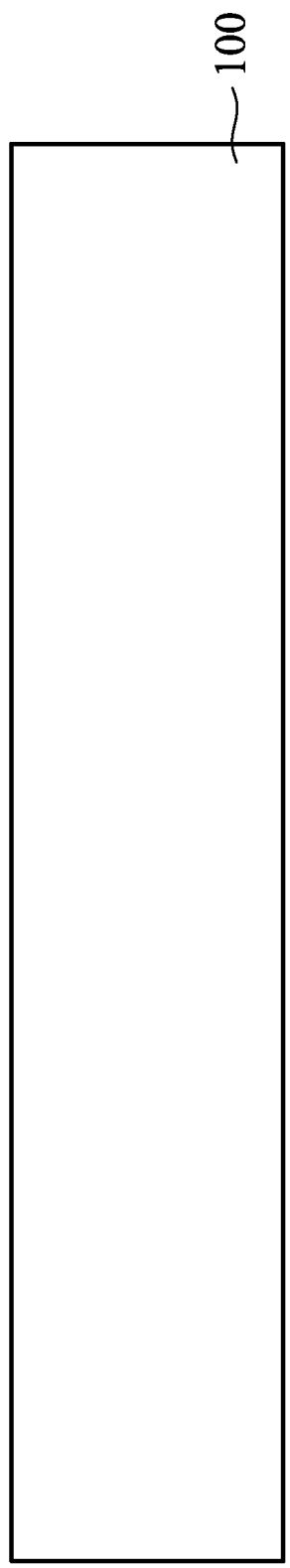
FIGS. 1-11 are a series of cross-sectional views illustrating a method for forming a split-gate flash memory cell according to an embodiment of the present disclosure.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various embodiments. This repetition is for the purpose of simplicity and clarity and does not in itself dictate a relationship between the various embodiments and/or configurations discussed.

Various embodiments of the present disclosure will be discussed below. Like reference numerals may be used to represent like components. It should be understood that additional steps may be implemented before, during, or after the illustrated methods, and some steps might be replaced or omitted in other embodiments of the illustrated methods.

The split-gate flash memory cell according to the embodiments of the present disclosure includes a floating gate which contains a pair of conductive spacers disposed on a top surface of a conductive layer. The pair of conductive spacers may improve the performance of the split-gate flash memory cell (e.g., reducing the erasing time) of the embodiments of the present disclosure. A method for forming the split-gate flash memory cell according to an embodiment of the present disclosure will be discussed in the following of the present disclosure.

FIG. 1 illustrates an initial step of a method for forming the split-gate flash memory cell according to an embodiment of the present disclosure. As shown in FIG. 1, a semiconductor substrate 100 is provided. For example, the semiconductor substrate 100 may include silicon. In some embodiments, the semiconductor substrate 100 may include other elementary semiconductor (e.g., germanium), compound semiconductor (e.g., silicon carbide (SiC), gallium arsenic (GaAs), indium arsenide (InAs), or indium phosphide (InP)), and alloy semiconductor (e.g., silicon germanium (SiGe), silicon germanium carbide (SiGeC), gallium arsenic phosphide (GaAsP), or gallium indium phosphide (GaInP)). In other embodiments, the semiconductor substrate 100 may include a semiconductor-on-insulator (SOI) substrate. The SOI substrate may include a bottom substrate, a buried oxide layer disposed on the bottom substrate, and a semiconductor layer disposed on the buried oxide layer.

In some embodiments, the semiconductor substrate 100 is a p-type silicon substrate. For example, the dopant of the p-type silicon substrate 100 may include boron, aluminum, gallium, indium, another applicable dopant, or a combination thereof, and a dopant concentration of the p-type silicon substrate 100 may be $5 \times 10^{14}$ cm$^{-3}$ to $5 \times 10^{16}$ cm$^{-3}$. In other embodiments, the semiconductor substrate 100 may be an n-type silicon substrate. For example, the dopant of the n-type silicon substrate 100 may include arsenic, phosphorus, antimony, another applicable dopant, or a combination thereof, and a dopant concentration of the n-type silicon substrate 100 may be $5 \times 10^{14}$ cm$^{-3}$ to $5 \times 10^{16}$ cm$^{-3}$. In the interests of simplicity and clarity, the present embodiment uses a p-type silicon substrate 100 as an example, but the present disclosure is not limited thereto.

Figure 2:
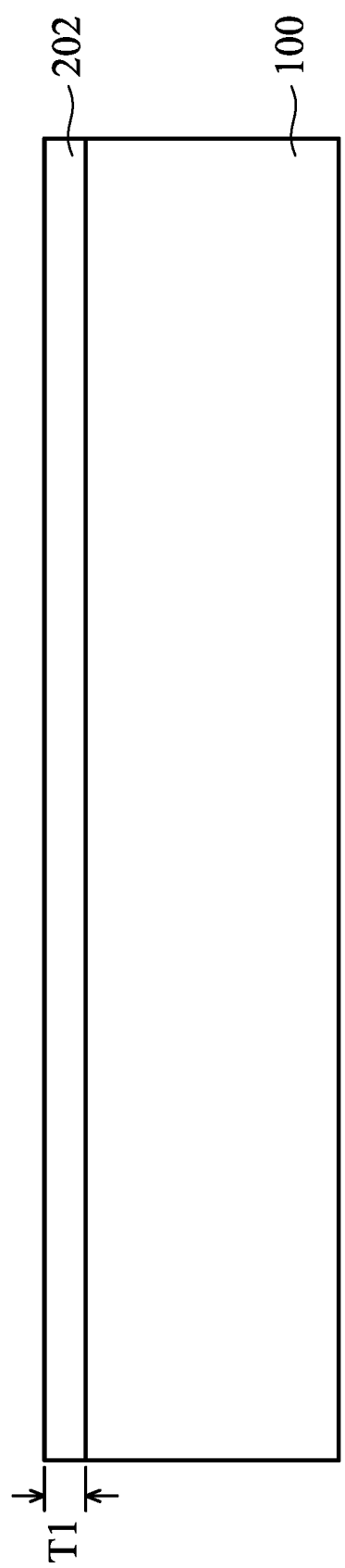

Referring to FIG. 2, a first dielectric layer 202 is formed on the semiconductor substrate 100. A portion of the first dielectric layer 202 may serve as the floating gate dielectric of the split-gate flash memory cell, and the details will be discussed later. In the embodiment illustrated, the first dielectric layer 202 includes silicon oxide. The silicon oxide may be formed by an oxidation process, a chemical vapor deposition process, another applicable process, or a combination thereof. For example, the oxidation process may include a dry oxidation process (e.g., $Si+O_2 \rightarrow SiO_2$), a wet oxidation process (e.g., $Si+2H_2O \rightarrow SiO_2+2H_2$), or a combination thereof.

In other embodiments, the first dielectric layer 202 includes a high-k dielectric material (e.g., the dielectric constant is greater than 3.9). For example, the high-k dielectric material may include $HfO_2$, LaO, AlO, ZrO, TiO, $Ta_2O_5$, $Y_2O_3$, $SrTiO_3$, $BaTiO_3$, BaZrO, HfZrO, HfLaO, HfTaO, HfSiO, HfSiON, HfTiO, LaSiO, AlSiO, (Ba, Sr)$TiO_3$, $Al_2O_3$, another applicable high-k dielectric material, or a combination thereof. For example, the high-k dielectric layer may be formed by a chemical vapor deposition process (e.g., a plasma enhanced chemical vapor deposition (PECVD) process, or a metalorganic chemical vapor deposition (MOCVD) process), an atomic layer deposition (ALD) process (e.g., a plasma enhanced atomic layer deposition (PEALD) process), a physical vapor deposition (PVD) process (e.g., a vacuum evaporation process, or a sputtering process), another applicable process, or a combination thereof.

In some embodiments, a thickness T1 of the first dielectric layer 202 may be 50 Å to 300 Å, but it is not limited thereto.

Figure 3:
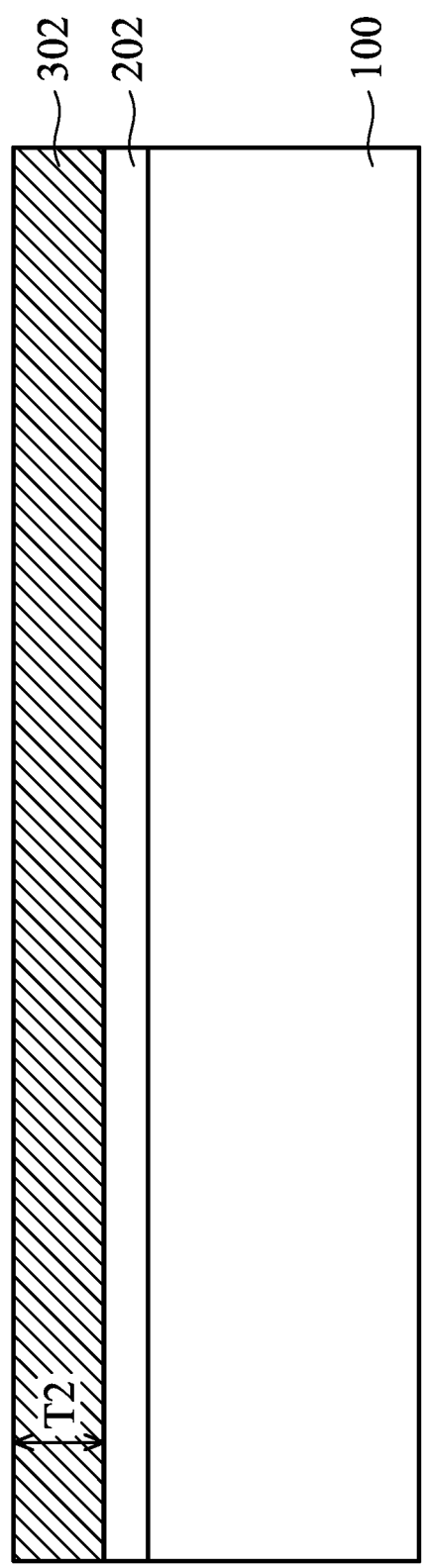

Then, as shown in FIG. 3, a first conductive layer 302 is formed on the first dielectric layer 202. In the embodiment illustrated, the first conductive layer 302 includes poly-silicon. In other embodiments, the first conductive layer 302 may include metals (e.g., tungsten, titanium, aluminum, copper, molybdenum, nickel, platinum, the like, or a combination thereof), metal alloys, metal-nitrides (e.g., tungsten nitride, molybdenum nitride, titanium nitride, and tantalum nitride, the like, or a combination thereof), metal-silicides (e.g., tungsten silicide, titanium silicide, cobalt silicide, nickel silicide, platinum silicide, erbium silicide, the like, or a combination thereof), metal-oxides (e.g., ruthenium oxide, indium tin oxide, the like, or a combination thereof), another applicable material, or a combination thereof.

For example, the first conductive layer 302 may be formed by a chemical vapor deposition process (e.g., a low pressure chemical vapor deposition process (LPCVD), or a plasma enhanced chemical vapor deposition process), a physical vapor deposition process (e.g., a vacuum evaporation process, or a sputtering process), another applicable process, or a combination thereof.

In some embodiments, a thickness T2 of the first conductive layer 302 may be 0.05 to 0.5 μm, but it is not limited thereto.

Figure 4:
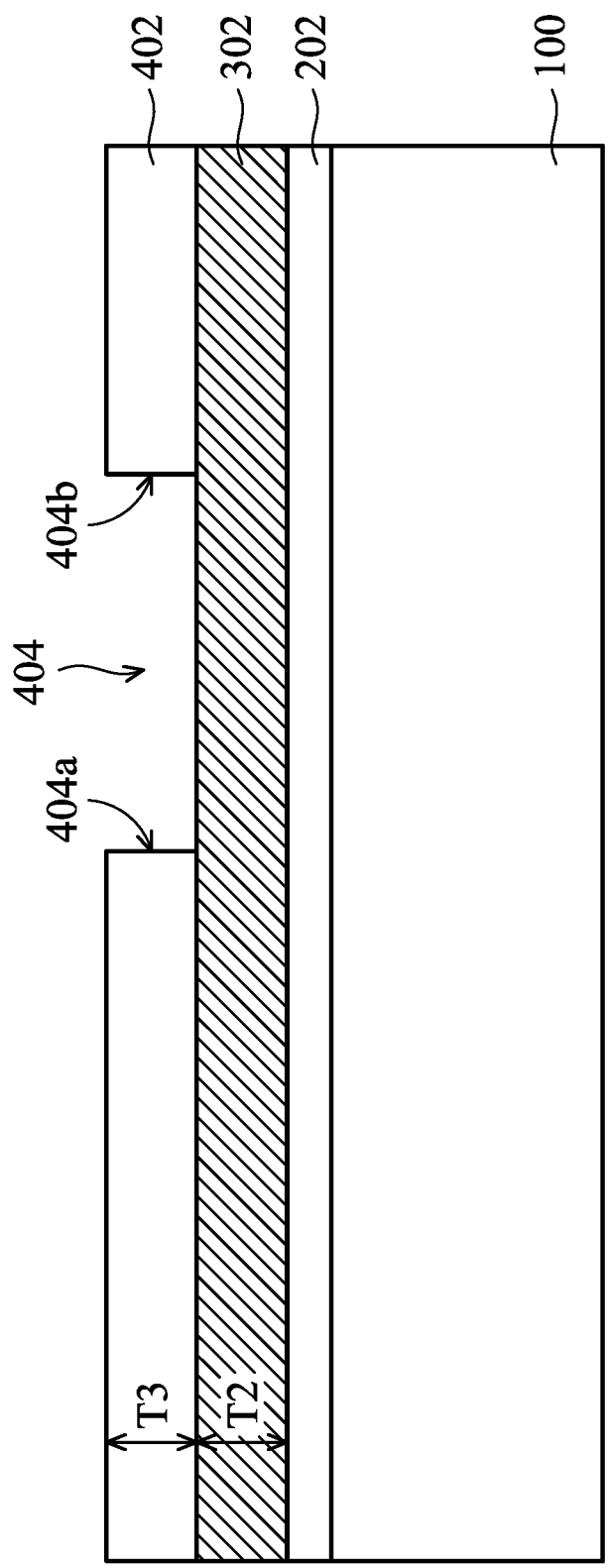

Then, as shown in FIG. 4, a mask layer 402 is formed on the first conductive layer 302, and an opening 404 having opposite sidewalls 404a and 404b is formed in the mask layer 402. As shown in FIG. 4, a portion of the conductive layer 302 is exposed by the opening 404. In some embodiments, the opening 404 exposes the portion of the conductive layer 302 to be formed as the floating gate of the split-gate flash memory cell, and the details will be discussed later.

In some embodiments, the mask layer 402 may include silicon nitride, silicon oxynitride, another applicable material, or a combination thereof. For example, the mask layer 402 may be formed by a low pressure chemical vapor deposition process, a plasma enhanced chemical vapor deposition process, another applicable process, or a combination thereof. For example, a thickness T3 of the mask layer 402 may be 0.1 to 0.5 μm, but it is not limited thereto.

In some embodiments, the opening 404 may be formed in the mask layer 402 by a patterning process. For example, the patterning process may include a lithography process (e.g., photoresist coating, soft baking, mask aligning, exposure, post-exposure baking, developing photoresist, another applicable process, or a combination thereof), an etching process (e.g., a wet etching process, a dry etching process, another applicable process, or a combination thereof), another applicable process, or a combination thereof. In some embodiments, a patterned photoresist layer (not shown) having an opening corresponding to the opening 404 may be formed on the mask layer 402 by a lithography process, and then an etching process may be performed to remove a portion of the mask layer 402 exposed by the opening of the patterned photoresist layer (not shown) to form the opening 404 in the mask layer 402.

Figure 5:
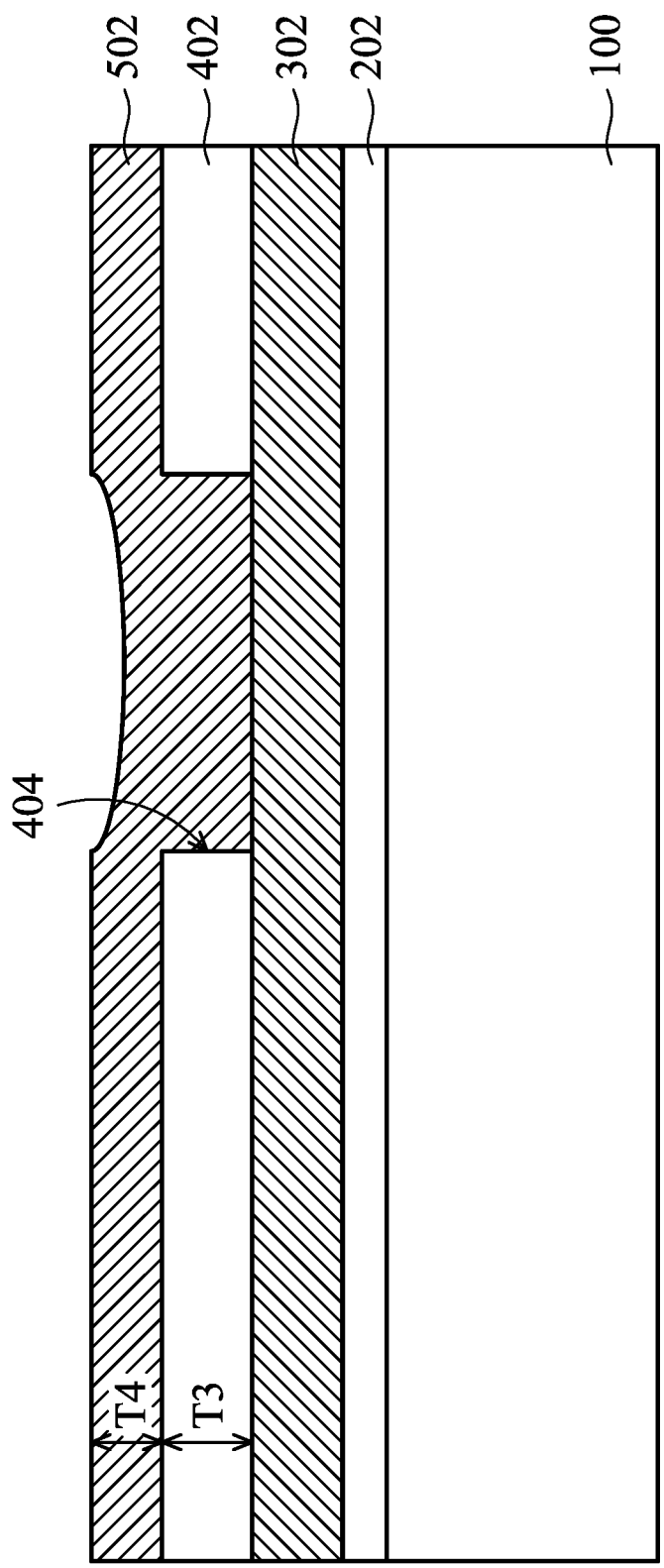

Then, as shown in FIG. 5, a second conductive layer 502 is formed on the mask layer 402 and the portion of the first conductive layer 302 exposed by the opening 404. The second conductive layer 502 in the opening 404 will be anisotropically etched back to form conductive spacers on opposite sidewalls 404a and 404b of the opening 404. In the embodiment illustrated, the second conductive layer 502 includes poly-silicon. In other embodiments, the second conductive layer 502 may include metals (e.g., tungsten, titanium, aluminum, copper, molybdenum, nickel, platinum, the like, or a combination thereof), metal alloys, metal-nitrides (e.g., tungsten nitride, molybdenum nitride, titanium nitride, and tantalum nitride, the like, or a combination thereof), metal-silicides (e.g., tungsten silicide, titanium silicide, cobalt silicide, nickel silicide, platinum silicide, erbium silicide, the like, or a combination thereof), metal-oxides (e.g., ruthenium oxide, indium tin oxide, the like, or a combination thereof), another applicable material, or a combination thereof.

For example, the second conductive layer 502 may be formed by a chemical vapor deposition process (e.g., a low pressure chemical vapor deposition process, or a plasma enhanced chemical vapor deposition process), a physical vapor deposition process (e.g., a vacuum evaporation process, or a sputtering process), another applicable process, or a combination thereof.

In some embodiments, the first conductive layer 302 and the second conductive layer 502 may include the same material (e.g., the first conductive layer 302 and the second conductive layer 502 both include poly-silicon in the embodiment illustrated). However, the first conductive layer 302 and the second conductive layer 502 may include different materials in other embodiments.

For example, a thickness T4 of the second conductive layer 502 may be 0.1 to 0.4 μm, but it is not limited thereto.

Figure 6:
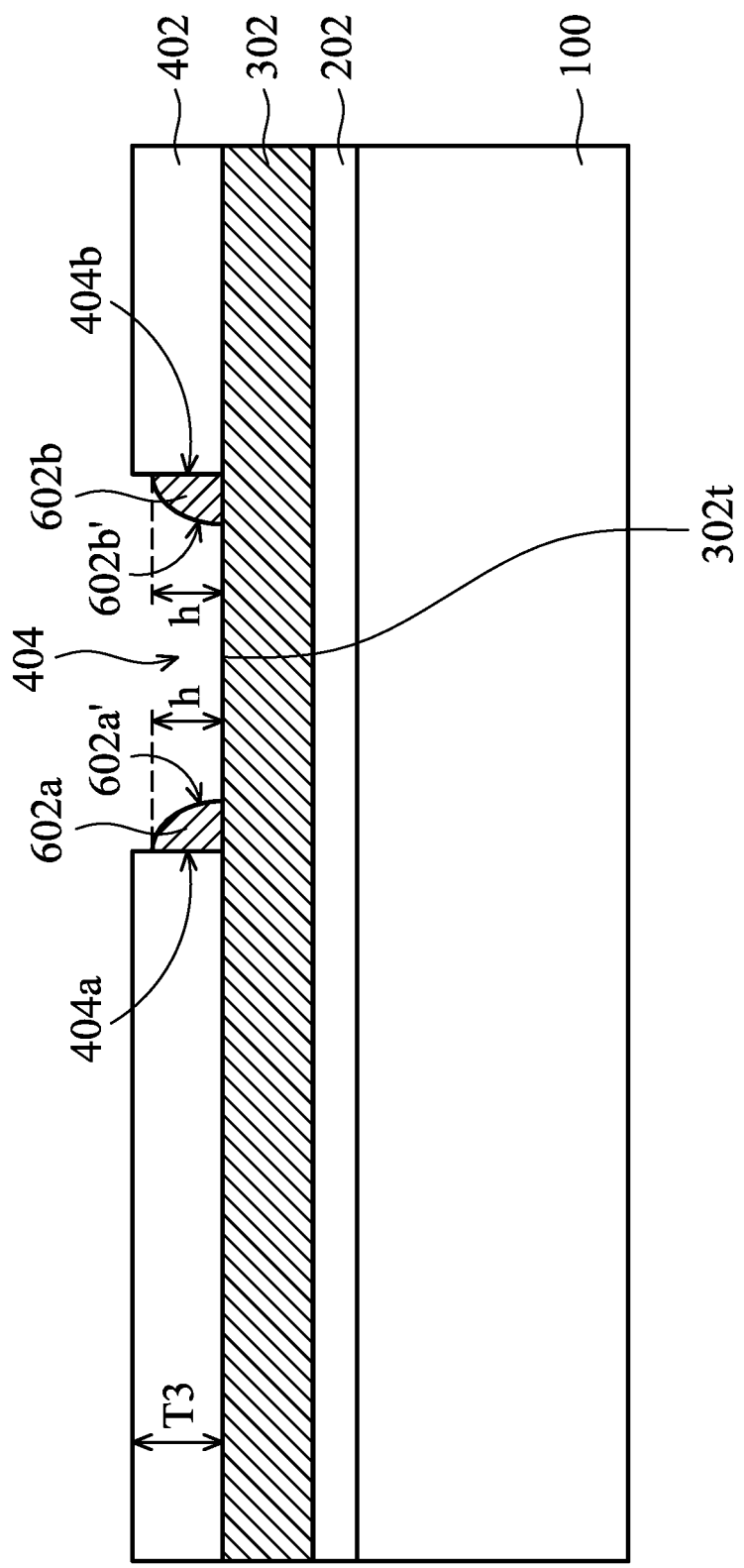

Then, as shown in FIG. 6, the second conductive layer 502 is anisotropically etched back to form conductive spacers 602a and 602b of the floating gate of the split-gate flash memory cell on the opposite sidewalls 404a and 404b of the opening 404 and on a top surface 302t of the portion of first conductive layer 302 exposed by the opening 404. The conductive spacers 602a and 602b, and the portion of the conductive layer 302 under the opening 404 will together serve as the floating gate of the split-gate flash memory cell.

In some embodiments, the second conductive layer 502 may be anisotropically etched back by a dry etching process (e.g., a plasma etching process, or a reactive ion etching process).

In some embodiments, after the etch back process, the conductive spacer 602a may have a first sloped sidewall 602a', and the conductive spacer 602b may have a second sloped sidewall 602b' facing the first sloped sidewall 602a' (as shown in FIG. 6).

In some embodiments, the pair of conductive spacers 602a and 602b are below a top surface of the mask layer 402 after the etch back process, which may be advantageous to a subsequent process for forming the floating gate of the split-gate flash memory cell, and the details will be discussed later. For example, a height h of each of the conductive spacers 602a and 602b may be 0.08 to 0.33 μm, and a ratio of the height h to the thickness T3 of the mask layer 402 may be 0.6 to 0.95.

Figure 7:
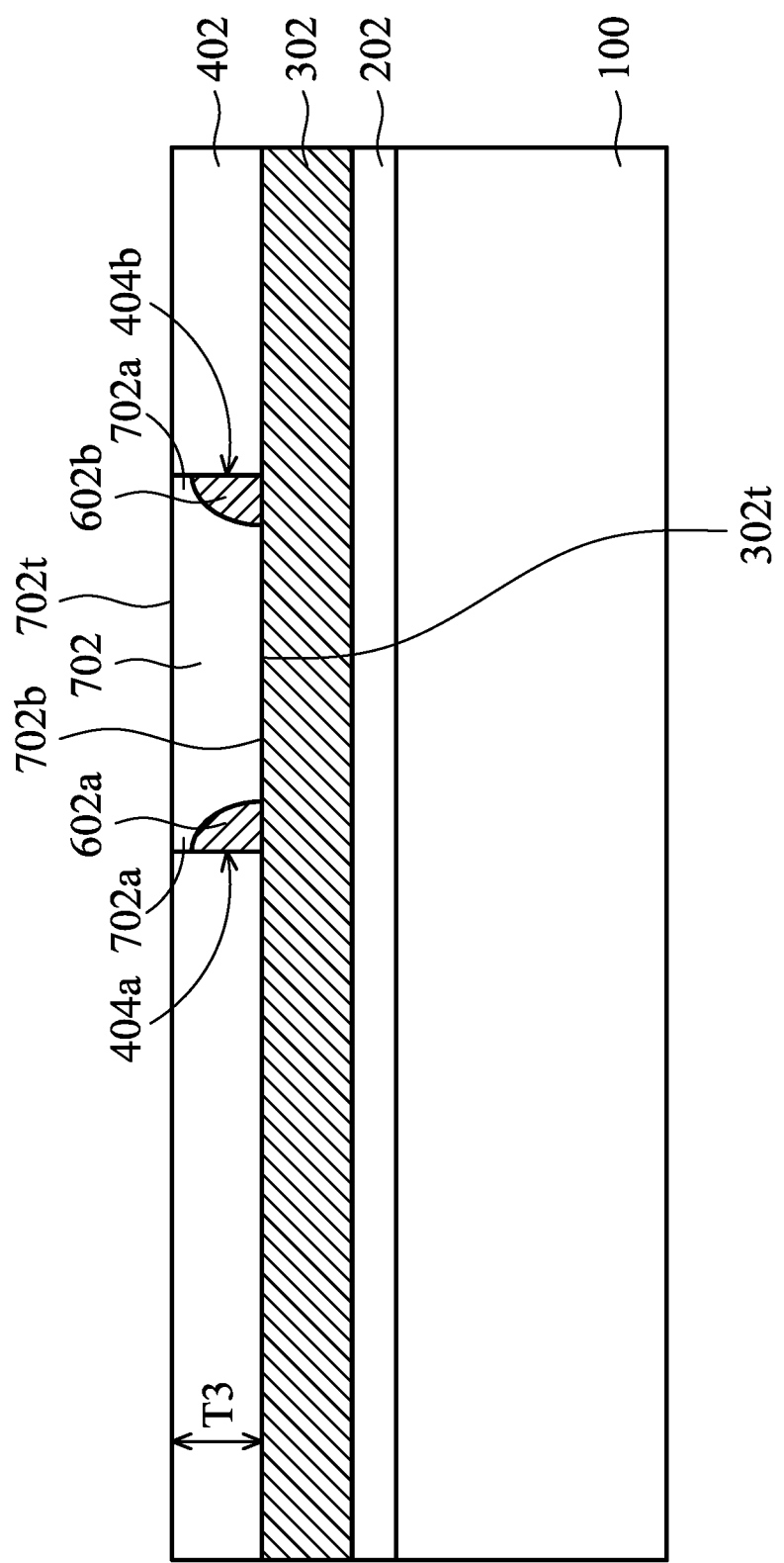

Then, as shown in FIG. 7, a dielectric material 702 is formed to fill the opening 404. The dielectric material 702 is different from the material of the mask layer 402 and the first conductive layer 302, and will be used as an etch mask in a subsequent process to form the floating gate of the split-gate flash memory cell.

In the embodiment illustrated, the dielectric material 702 includes silicon oxide. In other embodiments, the dielectric material 702 may include $HfO_2$, LaO, AlO, ZrO, TiO, $Ta_2O_5$, $Y_2O_3$, $SrTiO_3$, $BaTiO_3$, BaZrO, HfZrO, HfLaO, HfTaO, HfSiO, HfSiON, HfTiO, LaSiO, AlSiO, (Ba, Sr)$TiO_3$, $Al_2O_3$, another applicable high-k dielectric material, or a combination thereof.

In some embodiments, the dielectric material 702 may be formed by overfilling the opening 404, followed by a planarization process. For example, a chemical vapor deposition process (e.g., a plasma enhanced chemical vapor deposition process, or a metalorganic chemical vapor deposition process), a spin-on coating process, an atomic layer deposition process (e.g., a plasma enhanced atomic layer deposition process), a physical vapor deposition process (e.g., a vacuum evaporation process, or a sputtering process), another applicable process, or a combination thereof may be performed to form a dielectric layer (not shown) on the mask layer 402 to overfill the opening 404, and then an etch back process or a chemical-mechanical-polishing (CMP) process may be performed to remove portions of the dielectric layer (not shown) outside the opening 404, while the remaining portion of the dielectric layer (not shown) in the opening 404 serves as the dielectric material 702.

In some embodiments, as shown in FIG. 7, the dielectric material 702 may have a substantially planar top surface 702t which is level with the top surface of the mask layer 402 after performing the chemical-mechanical-polishing process or the etch back process.

In some embodiments, as shown in FIG. 7, the dielectric material 702 has a substantially planar bottom surface 702b which is in direct contact with the top surface 302t of the portion of the first conductive layer 302 under the opening 404.

Figure 8:
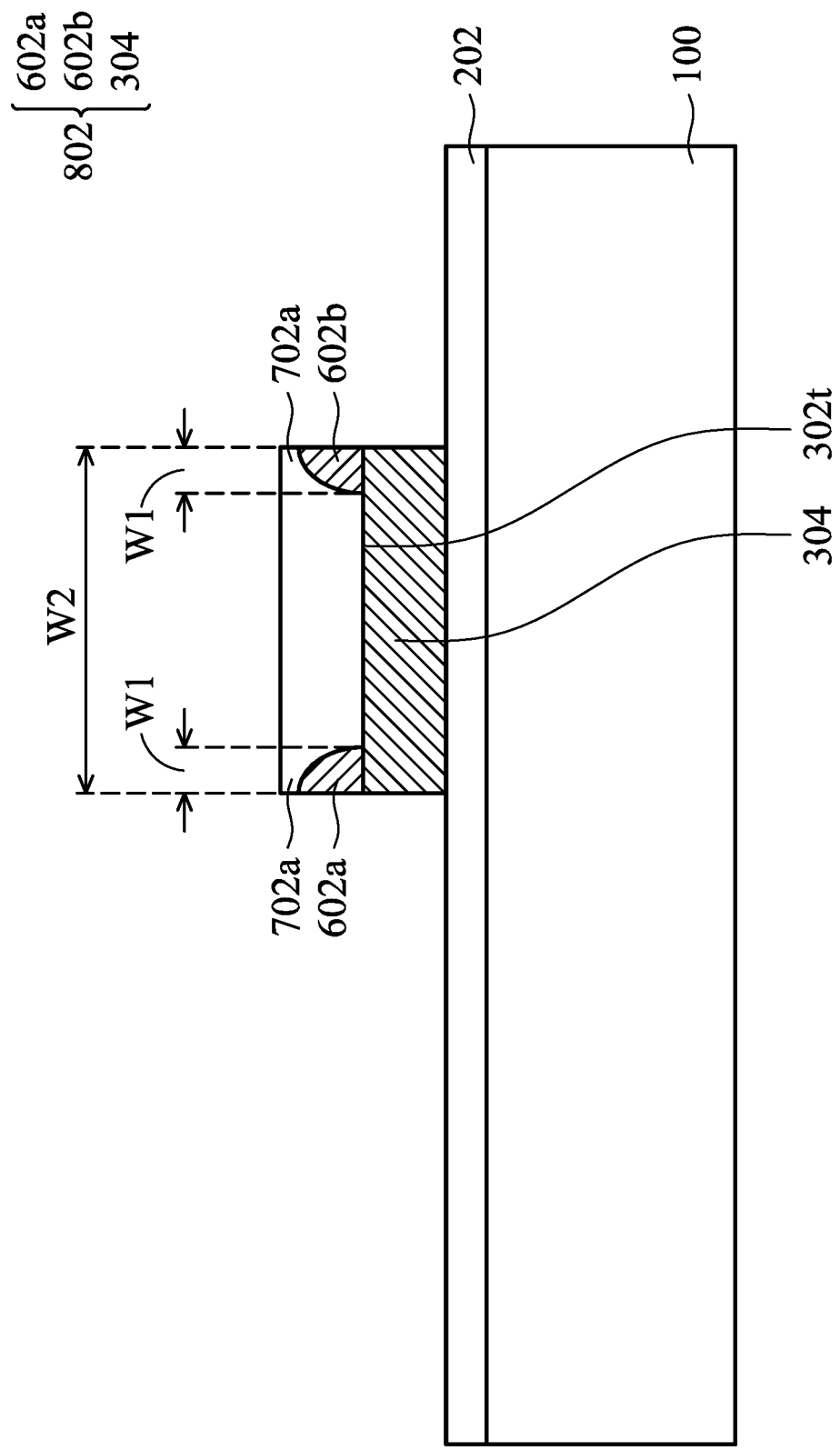

Then, as shown in FIG. 8, the mask layer 402 and portions of the first conductive layer 302 under the mask layer 402 are removed by an etching process (e.g., a wet etching process or a dry etching process) or another applicable process, while the pair of conductive spacers 602a and 602b, and the portion of the first conductive layer 302 under the opening 404 are left on the first dielectric layer 202 to serve as a floating gate 802 (i.e., the floating gate 802 includes the portion of the first conductive layer 302 under the opening 404 and the pair of conductive spacers 602a and 602b). It should be noted that the portion of the first conductive layer 302 left on the first dielectric layer 202 may also be referred to as the conductive layer 304 of the floating gate 802 in the following paragraphs of the present disclosure.

Referring back to FIG. 7, the dielectric material 702 may be used as an etch mask in the etching process for forming the floating gate 802. In the embodiments where the conductive spacers 602a and 602b are below the top surface of the mask layer 402, the dielectric material 702 can have a portion 702a substantially above the top of the conductive spacers 602a and 602b to protect the conductive spacers 602a and 602b from etching damage.

In some embodiments, as shown in FIG. 8, the pair of conductive spacers 602a and 602b are on opposite top edges of the conductive layer 304 of the floating gate 802.

As shown in FIG. 8, each of the conductive spacers 602a and 602b may have a bottom width W1, and the conductive layer 304 of the floating gate 802 may have a top width W2. The ratio of W1 to W2 (i.e., W1/W2) may depend on the ratio of h to T3 (i.e., h/T3). In some embodiments where the ratio of h to T3 is close to 1 (e.g., in a range between 0.8 and 1), the ratio of W1 to W2 may be lower (e.g., in a range between 0.3 and 0.425), but the manufacturing cost may be higher. In other embodiments where the ratio of h to T3 is lower (e.g., in a range between 0.3 and 0.7), the ratio of W1 to W2 may be higher (e.g., greater than 0.485), but the spacer tip may not be sharp enough for good erase efficiency. Therefore, in the embodiment illustrated, the ratio of the bottom width W1 of the conductive spacers 602a and 602b to the top width W2 of the conductive layer 304 of the floating gate 802 is in a range between 0.425 and 0.485 to avoid the above disadvantages.

Figure 9:
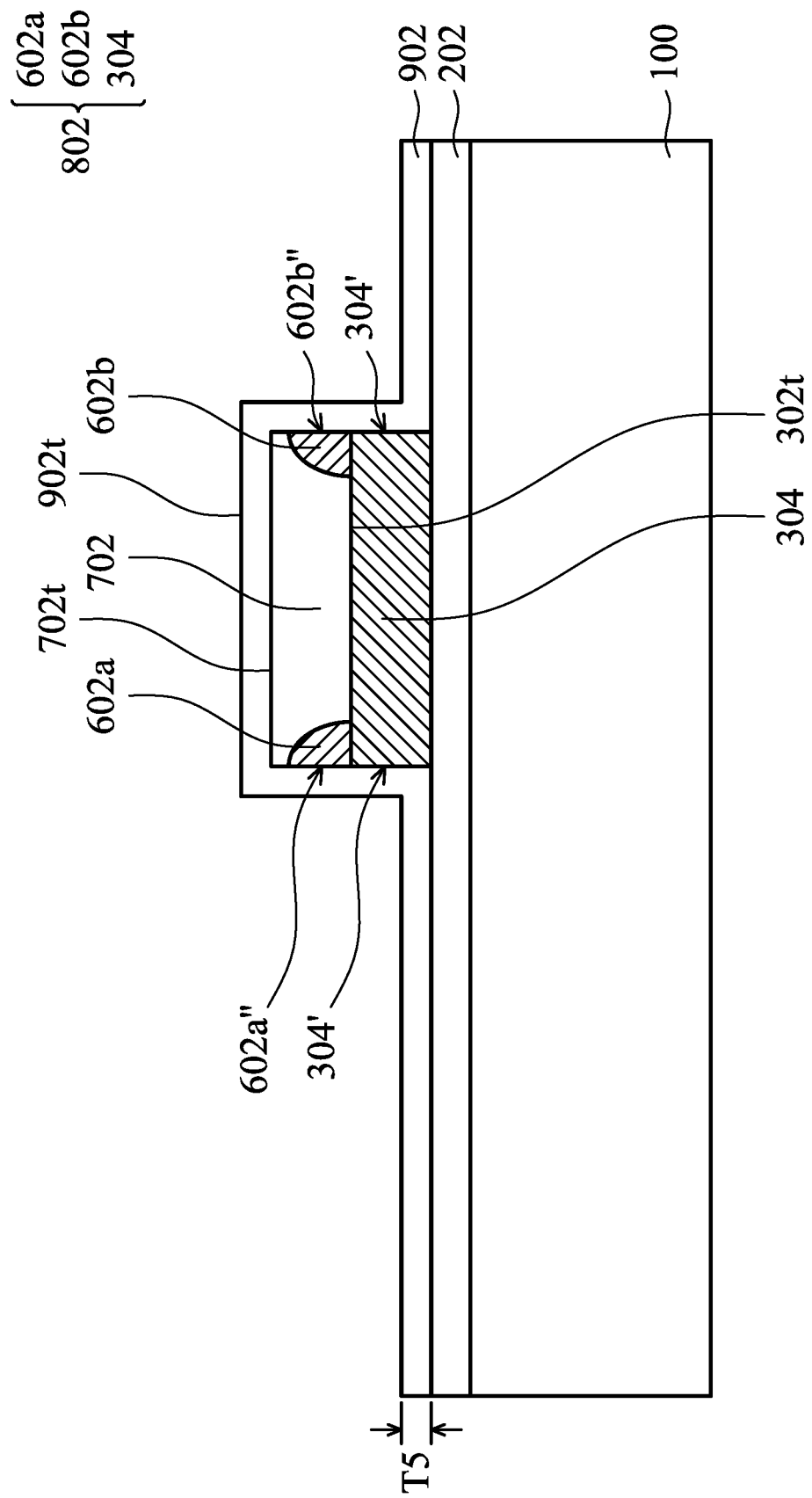

Then, as shown in FIG. 9, a second dielectric layer 902 is formed on the first dielectric layer 202, sidewalls 304' of the conductive layer 304 of the floating gate 802, sidewalls 602a'' and 602b'' of the conductive spacers 602a and 602b, and the dielectric material 702. A portion of the second dielectric layer 902 and the dielectric material 702 may serve as the inter-gate dielectric of the split-gate flash memory cell, and the details will be discussed later. In some embodiments, a top surface 902t of the second dielectric layer 902 may be substantially planar since it is conformally formed on the substantially planar top surface 702t of the dielectric material 702.

In the embodiment illustrated, the second dielectric layer 902 includes silicon oxide. The silicon oxide may be formed by an oxidation process (e.g., a dry oxidation process, or a wet oxidation process), a chemical vapor deposition process, another applicable process, or a combination thereof.

In other embodiments, the second dielectric layer 902 includes a high-k dielectric material. The high-k dielectric material may include $HfO_2$, LaO, AlO, ZrO, TiO, $Ta_2O_5$, $Y_2O_3$, $SrTiO_3$, $BaTiO_3$, BaZrO, HfZrO, HfLaO, HfTaO, HfSiO, HfSiON, HfSiO, LaSiO, AlSiO, (Ba, Sr)$TiO_3$, $Al_2O_3$, another applicable high-k dielectric material, or a combination thereof. For example, the high-k dielectric layer may be formed by a chemical vapor deposition process (e.g., a plasma enhanced chemical vapor deposition process, or a metalorganic chemical vapor deposition process), an atomic layer deposition process (e.g., a plasma enhanced atomic layer deposition process), a physical vapor deposition process (e.g., a vacuum evaporation process, or a sputtering process), another applicable process, or a combination thereof.

For example, a thickness T5 of the second dielectric layer 902 may be 50 Å to 250 Å μm, but it is not limited thereto.

Figure 10:
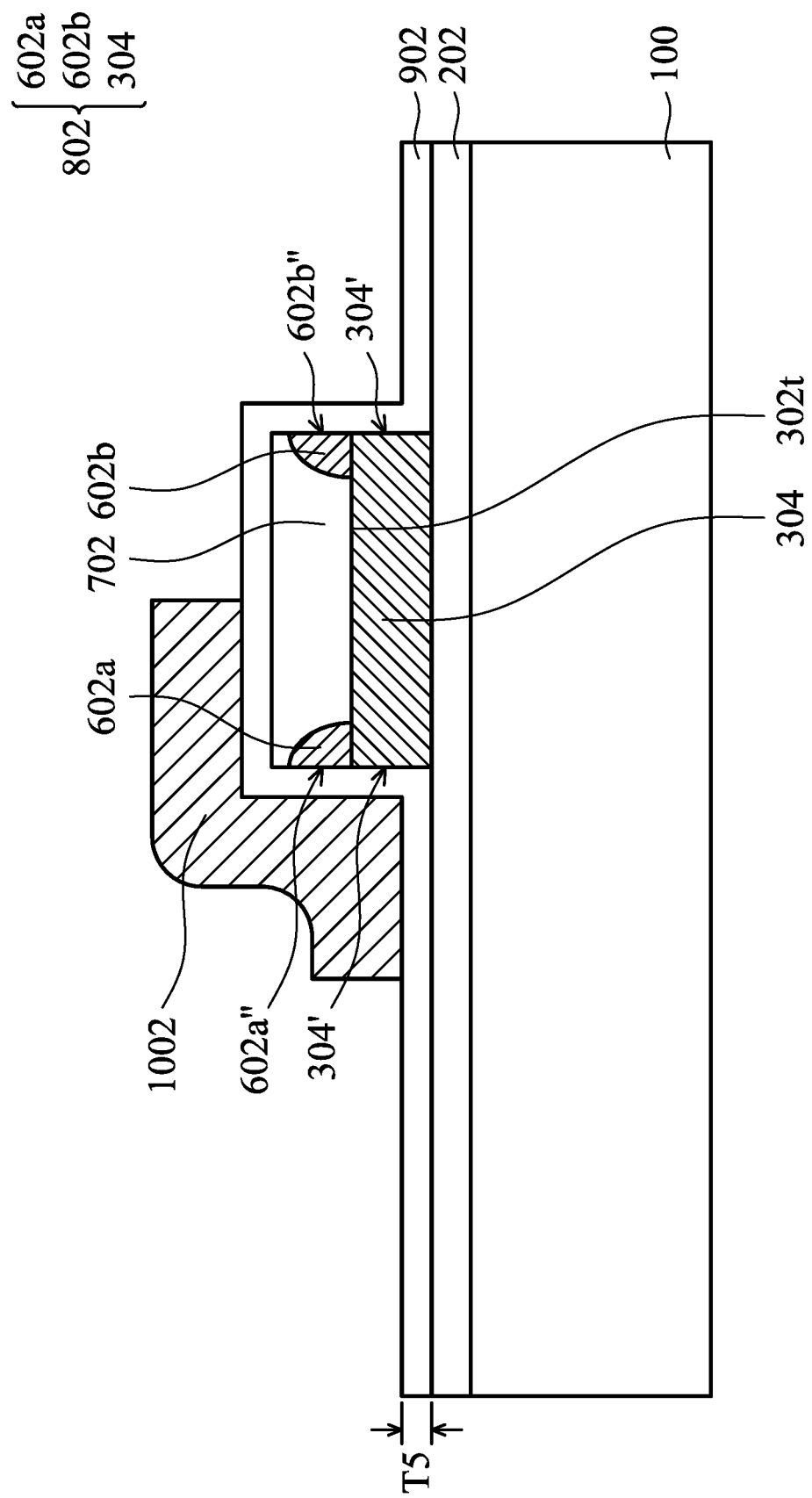

Then, as shown in FIG. 10, a control gate 1002 is formed on the first dielectric layer 202, the second dielectric layer 902, and the dielectric material 702. In the embodiment illustrated, the control gate 1002 includes poly-silicon. In other embodiments, the control gate 1002 may include metals (e.g., tungsten, titanium, aluminum, copper, molybdenum, nickel, platinum, the like, or a combination thereof), metal alloys, metal-nitrides (e.g., tungsten nitride, molybdenum nitride, titanium nitride, and tantalum nitride, the like, or a combination thereof), metal-silicides (e.g., tungsten silicide, titanium silicide, cobalt silicide, nickel silicide, platinum silicide, erbium silicide, the like, or a combination thereof), metal-oxides (e.g., ruthenium oxide, indium tin oxide, the like, or a combination thereof), another applicable material, or a combination thereof.

For example, the control gate 1002 may be formed by a deposition process followed by a patterning process. The deposition process may include chemical vapor deposition process (e.g., a low pressure chemical vapor deposition process, or a plasma enhanced chemical vapor deposition process), a physical vapor deposition process (e.g., a vacuum evaporation process, or a sputtering process), another applicable process, or a combination thereof. The patterning process may include an etching process.

Figure 11:
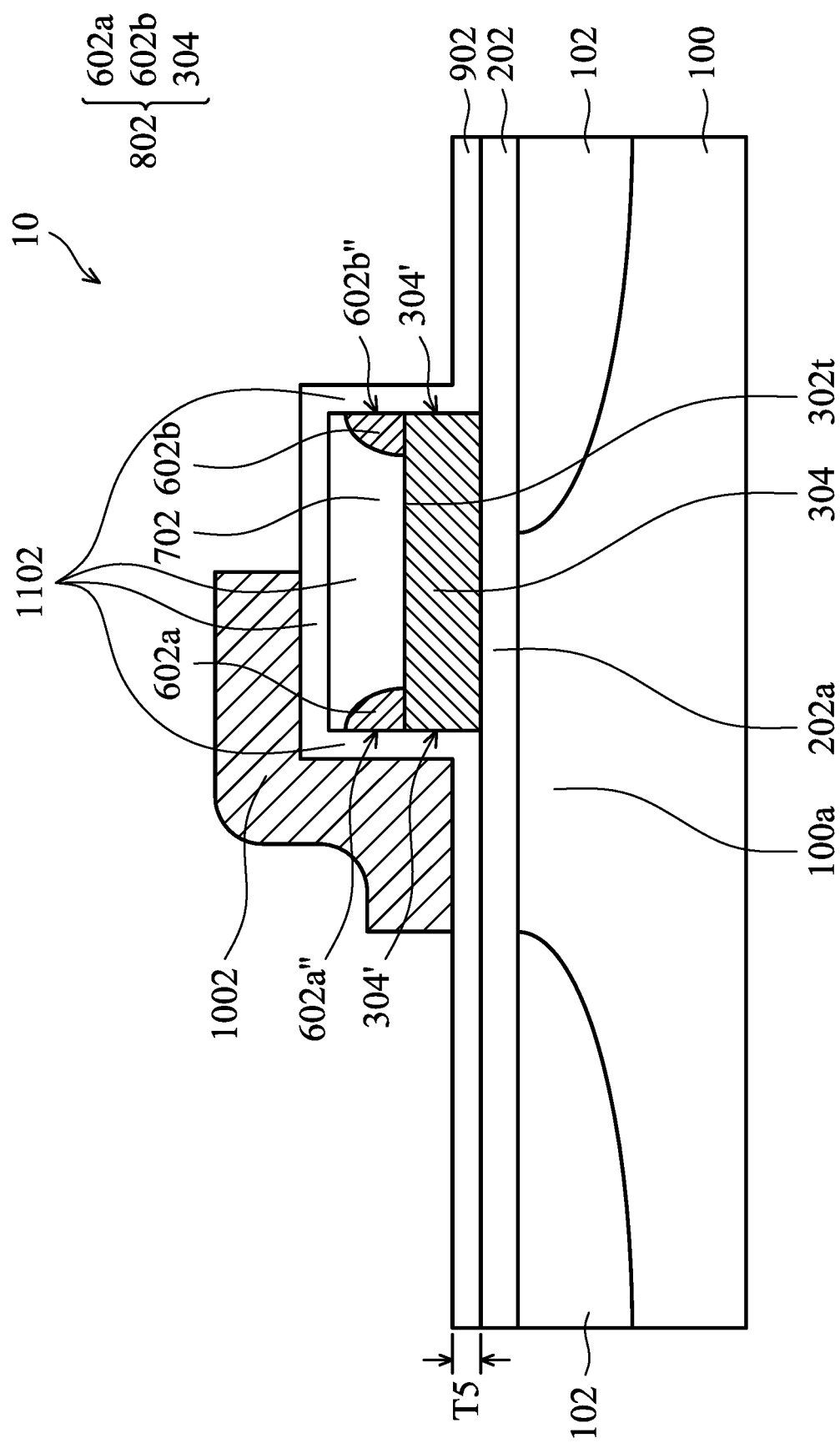

Then, as shown in FIG. 11, source/drain regions 102 may be formed in the semiconductor substrate 100. The source/drain regions 102 may be separated by a channel region 100a in the semiconductor substrate 100 under the control gate 1002. In the embodiment illustrated, the source/drain regions 102 are doped with n-type dopants. For example, the control gate 1002 may be used as a mask in an implantation process to implant phosphorous ions or arsenic ions into the semiconductor substrate 100 on opposite sides of the control gate 1002 to form the source/drain regions 102 with a dopant concentration of $5 \times 10^{17}$ cm$^{-3}$ to $5 \times 10^{20}$ cm$^{-3}$. In other embodiments, the semiconductor substrate 100 is an n-type silicon substrate, and thus the source/drain regions 102 are doped with p-type dopants (e.g., boron, aluminum, gallium, indium, another applicable dopant, or a combination thereof), and a dopant concentration of the source/drain regions 102 may be $5 \times 10^{17}$ cm$^{-3}$ to $5 \times 10^{20}$ cm$^{-3}$.

As shown in FIG. 11, a split-gate flash memory cell 10 is formed. The split-gate flash memory cell 10 includes the floating gate 802 containing the conductive layer 304 and the pair of conductive spacers 602a and 602b. A portion 202a of the first dielectric layer 202 under the floating gate 802 may be referred to as the floating gate dielectric, and portions of the second dielectric layer 902 covering the floating gate 802 combined with the dielectric material 702 may be referred to as the inter-gate dielectric 1102. In some embodiments, as shown in FIG. 11, the floating gate 802 may be completely encapsulated by the floating gate dielectric 202a and the inter-gate dielectric 1102. As shown in FIG. 11, the inter-gate dielectric 1102 may cover sidewalls 304' of the conductive layer 304, and sidewalls 602a'' and 602b'' of the conductive spacers 602a and 602b.

In summary, the split-gate flash memory cell according to embodiments of the present disclosure includes a floating gate which contains a pair of conductive spacers disposed on a top surface of a conductive layer. The pair of conductive spacers may increase the current flow between the floating gate and the control gate, thus improving the performance of the split-gate flash memory cell (e.g., reducing the erasing time).

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Furthermore, each claim may be an individual embodiment of the present disclosure, and the scope of the present disclosure includes the combinations of every claim and every embodiment of the present disclosure.

In addition, although some embodiments of the present disclosure are disclosed above, they are not intended to limit the scope of the present disclosure. Furthermore, not all advantages of the embodiments of the present disclosure are discussed. In addition, those skilled in the art may make various changes, substitutions, and alterations herein without departing from the spirit and scope of the embodiments of the present disclosure. Therefore, the scope of protection should be determined by the claims.

What is claimed is:

1. A split-gate flash memory cell, comprising:
a semiconductor substrate;
a floating gate dielectric on the semiconductor substrate;
a floating gate comprising:
   a conductive layer on the floating gate dielectric; and
   a pair of conductive spacers on a top surface of the conductive layer;
a dielectric etch mask on the conductive layer, wherein the dielectric etch mask has a portion above the top of the conductive spacers;
a dielectric layer covering the floating gate, including sidewalls of the conductive layer and the conductive spacers; and
a control gate on the dielectric layer;
wherein outer sidewalls of the pair of conductive spacers are aligned with sidewalls of the conductive layer.

2. The split-gate flash memory cell of claim 1, wherein the dielectric etch mask has a planar top surface.

3. The split-gate flash memory cell of claim 1, wherein the dielectric layer and the floating gate dielectric completely encapsulates the floating gate.

4. The split-gate flash memory cell of claim 1, wherein the dielectric etch mask comprises a bottom portion having a planar bottom surface in contact with the top surface of the conductive layer of the floating gate.

5. The split-gate flash memory cell of claim 1, wherein the pair of conductive spacers are disposed on opposite top edges of the conductive layer.

6. The split-gate flash memory cell of claim 1, wherein one of the conductive spacers has a first sloped sidewall, and the other one of the conductive spacers has a second sloped sidewall, and the first sloped sidewall and the second sloped sidewall face each other.

7. The split-gate flash memory cell of claim 1, wherein a height of one of the conductive spacers is in a range between 0.08 and 0.33 μm.

8. The split-gate flash memory cell of claim 1, wherein a ratio of a bottom width of one of the conductive spacers to a top width of the conductive layer is in a range between 0.425 and 0.485.

9. A method for forming a split-gate flash memory cell, comprising:
providing a semiconductor substrate;
forming a first dielectric layer on the semiconductor substrate;
forming a first conductive layer on the first dielectric layer;
forming a mask layer on the first conductive layer, wherein the mask layer has an opening exposing a first portion of the first conductive layer;
forming a pair of conductive spacers on opposite sidewalls of the opening and on a top surface of the first portion of the first conductive layer;
forming a dielectric material to fill the opening, wherein the dielectric material has a portion above the top of the conductive spacers;
removing the mask layer and portions of the first conductive layer under the mask layer, while leaving the pair of conductive spacers and the first portion of the first conductive layer whereby a floating gate is formed on the first dielectric layer;
forming a second dielectric layer on sidewalls of the first portion of the first conductive layer and the pair of conductive spacers; and
forming a control gate on the first dielectric layer, the second dielectric layer and the dielectric material;
wherein outer sidewalls of the pair of conductive spacers are aligned with sidewalls of the first portion of the first conductive layer.

10. The method for forming a split-gate flash memory cell of claim 9, wherein the step of forming the pair of conductive spacers on the opposite sidewalls of the opening comprises:
forming a second conductive layer on the mask layer and the first portion of the first conductive layer; and
anisotropically etching back the second conductive layer to form the pair of conductive spacers on the opposite sidewalls of the opening.

11. The method for forming a split-gate flash memory cell of claim 9, wherein the dielectric material has a planar bottom surface in contact with the top surface of the first portion of the first conductive layer.

12. The method for forming a split-gate flash memory cell of claim 9, wherein the dielectric material has a planar top surface.

13. The method for forming a split-gate flash memory cell of claim 9, wherein the pair of conductive spacers are below a top surface of the mask layer.

14. The method for forming a split-gate flash memory cell of claim 9, wherein the step of removing the mask layer and the portions of the first conductive layer under the mask layer comprises:
using the dielectric material as a mask to perform an etching process to remove the mask layer and the portions of the first conductive layer under the mask layer.

15. The method for forming a split-gate flash memory cell of claim 9, wherein the first conductive layer comprises poly-silicon.

16. The method for forming a split-gate flash memory cell of claim 9, wherein the step of forming the dielectric material comprises:
performing an etch back process, a chemical-mechanical-polishing process, or a combination thereof.

17. The method for forming a split-gate flash memory cell of claim 9, wherein the pair of conductive spacers are formed on opposite top edges of the first portion of the first conductive layer.

18. The method for forming a split-gate flash memory cell of claim 9, wherein one of the conductive spacers has a first sloped sidewall, and the other one of the conductive spacers has a second sloped sidewall, and the first sloped sidewall and the second sloped sidewall face each other.

19. The method for forming a split-gate flash memory cell of claim 9, wherein a height of one of the conductive spacers is in a range between 0.08 and 0.33 µm.

20. The method for forming a split-gate flash memory cell of claim 9, wherein a ratio of a bottom width of one of the conductive spacers to a top width of the first portion of the first conductive layer is in a range between 0.425 and 0.485.

* * * * *